United States Patent [19]

Murakami

[11] Patent Number: 5,410,163

[45] Date of Patent: Apr. 25, 1995

[54] SEMI-CONDUCTOR INTEGRATED CIRCUIT DEVICE INCLUDING CONNECTION AND DISCONNECTION MECHANISMS TO CONNECT AND DISCONNECT MONITOR CIRCUIT AND SEMICONDUCTOR INTEGRATED CIRCUIT FROM EACH OTHER

[75] Inventor: Shizuhiko Murakami, Kawasaki, Japan

[73] Assignee: Fujitsu Limited, Kawasaki, Japan

[21] Appl. No.: 296,587

[22] Filed: Aug. 29, 1994

Related U.S. Application Data

[63] Continuation of Ser. No. 31,848, Mar. 16, 1993, abandoned.

[30] Foreign Application Priority Data

Mar. 18, 1992 [JP] Japan .................................. 4-062619

[51] Int. Cl.6 .......................................... H01L 27/04
[52] U.S. Cl. ....................................... 257/48; 257/50; 257/530; 257/665
[58] Field of Search ................. 257/665, 50, 529, 530, 257/148, 48

[56] References Cited

U.S. PATENT DOCUMENTS

| | | | |
|---|---|---|---|
| 4,800,418 | 1/1989 | Natsui | 257/48 |
| 4,961,053 | 10/1990 | Krug | 257/148 |
| 5,025,298 | 6/1991 | Fay et al. | 257/529 |
| 5,105,235 | 4/1992 | Tomita | 257/367 |
| 5,200,919 | 4/1993 | Kaya | 257/321 |

FOREIGN PATENT DOCUMENTS 0290942 12/1991 Japan .................................. 257/367

*Primary Examiner*—William Mintel
*Assistant Examiner*—Alexander Oscar Williams
*Attorney, Agent, or Firm*—Staas & Halsey

[57] ABSTRACT

A monitor circuit provided in a chip in which a semiconductor integrated circuit is formed. Connection mechanisms and disconnection mechanisms are connected in series in wirings connected to the monitor circuit. Before using the semiconductor integrated circuit, in the state that the connection mechanisms are opened, the monitor circuit is tested without conducting the monitor circuit to the semiconductor integrated circuit. In the case of using the semiconductor integrated circuit, the connection mechanisms are written to close them, so that the monitor circuit is connected to the semiconductor circuit main body and is thus driven. Further, after using the semiconductor integrated circuit, the monitor circuit is separated from the semiconductor integrated circuit by writing the disconnection mechanisms, to be investigated for the characteristic.

11 Claims, 10 Drawing Sheets

SEMI-CONDUCTOR INTEGRATED CIRCUIT DEVICE INCLUDING CONNECTION AND DISCONNECTION MECHANISMS TO CONNECT AND DISCONNECT MONITOR CIRCUIT AND SEMICONDUCTOR INTEGRATED CIRCUIT FROM EACH OTHER

This application is a continuation of application Ser. No. 08/031,848, filed Mar. 16, 1993, now abandoned.

BACKGROUND OF THE INVENTION

1. Field of the Invention

The present invention relates to a semiconductor integrated circuit device including a monitor circuit for performing the characteristic test of semiconductor devices.

2. Description of the Related Art

In the semiconductor integrated circuit device, the characteristics of internal semiconductor devices have been investigated. However, since such a semiconductor device is connected to the other semiconductor devices, wirings and the like in the same circuit, it is added to the impedances thereof, which makes it difficult to independently investigate the objective device from the outside.

Accordingly, the isolated monitor circuit is built-in the semiconductor integrated circuit device, and the characteristic of the monitor circuit is tested. Thus, on the basis of the characteristic of the device thus obtained, the characteristic of the device in the semiconductor integrated circuit is estimated.

The monitor circuit electrically isolated from the semiconductor integrated circuit main body has been provided various semiconductor integrated circuit devices.

FIG. 1 (Prior Art) schematically shows the common relationship between a monitor circuit and a semiconductor integrated circuit main body, wherein a monitor circuit M is formed independently from a semiconductor integrated main body L, and various tests are made through pads P1 to P3 connected to the monitor circuit M.

In the case of testing the characteristic of the device used, however, the monitor circuit M described above is not suitable. The reason for this is as follows:

The change in characteristic of the device inside the semiconductor integrated circuit L used is often affected by the change in voltage or current during operation due to hot carrier, electromigration and the like. As a consequence, even if the characteristic change is investigated by driving the monitor circuit M independently from the semiconductor integrated circuit L, the result is actually different from the characteristic change of the device inside the semiconductor integrated circuit L.

In the case of testing the characteristic of the device used, the objective device is separated from the semiconductor integrated circuit main body L using the technique such as etching, laser cutting or the like, and further, the wirings connected to the device are exposed by etching the preventive film covering the device and the like by etching, thus carrying out the measurement using the above wirings as electrodes for testing.

The measurement for the characteristic of the device according to such processes takes a lot of labor and time, and also often causes the further characteristic change of the device during the operation, and therefore, it becomes difficult to accurately investigate the characteristic change due to the deterioration of the device.

SUMMARY OF THE INVENTION

An object of the present invention is to make easy the investigation of the characteristic of the circuit before and after usage, and to accurately monitor the characteristic change due to the deterioration of the device, in the case of investigating the characteristic of the device in a semiconductor integrated circuit device.

According to one mode of the present invention, a monitor circuit is mounted in a chip in which a semiconductor integrated circuit is formed. Further, on the midways of external wirings of the monitor circuit, wiring connection mechanisms for changing wirings from the disconnected states to the connected states through the writing operation are connected in series to wiring disconnection mechanisms for changing the wirings from the connected states to the disconnected states by the writing operation. First, in the state that the semiconductor integrated circuit device is not used, the test for the monitor circuit is made. Subsequently, by writing the wiring connecting mechanisms, the monitor circuit is made in the state being operated under the same condition as in the above circuit or the above device constituting a part of the semiconductor integrated circuit device. In the case of testing the monitor circuit after usage, by writing the wiring disconnection mechanisms, the monitor circuit is separated from the semiconductor integrated circuit main body.

DESCRIPTION OF THE PREFERRED EMBODIMENTS (a) Embodiment 1

Figure 1:
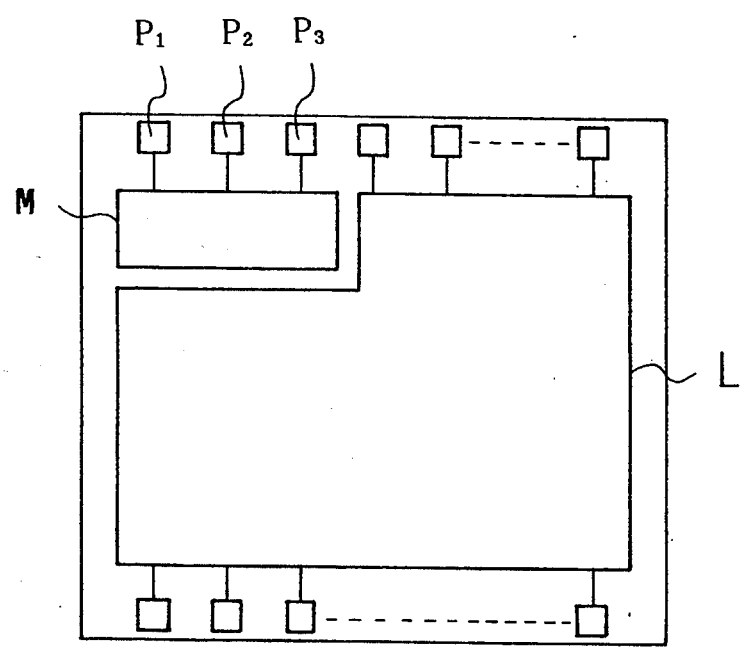
FIG. 1 is a circuit diagram of a prior art technique.
Figure 2:
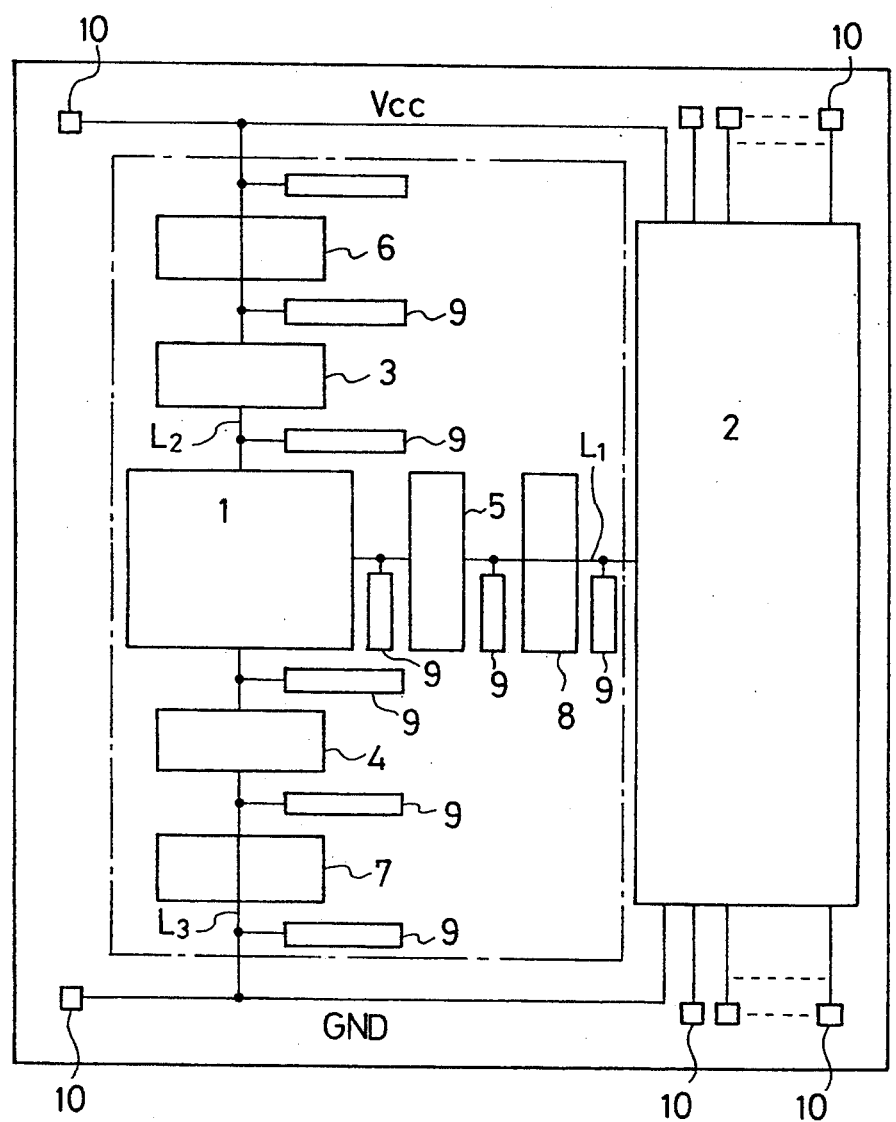
FIG. 2 is a circuit diagram of a first embodiment of the present invention.

FIG. 2 is a circuit diagram of a first embodiment of the present invention. In this diagram, numeral 1 indicates a monitor circuit within a semiconductor device formed on one semiconductor chip. The monitor circuit 1 has the same structure as that of an internal circuit constituting a part of a semiconductor integrated circuit main body 2. The monitor circuit 1 is connected to the semiconductor integrated circuit main body 2 and power supply wirings Vcc and GND through connection mechanisms 3 to 5 and disconnection mechanisms 6 to 8 described later, and which is operated just as in the internal circuit of the semiconductor integrated circuit main body 2.

The connection mechanisms 3 to 5, each of which comprises a dielectric breakdown type device, junction breakdown type device or the like including a switch function to make the wiring in the disconnected state, are connected in series to wirings L1 to L3 between the disconnection mechanisms 6 to 8 and the monitor 1, respectively. Thus, by writing the connection mechanisms 3 to 5, the wirings L1 to L3 are made to be conductive, respectively.

Also, the disconnection mechanisms 6 to 8, each of which comprises a fuse of polycrystalline silicon or the like having a switching function to disconnect each wiring, are connected in series to the wiring L1 for connecting the semiconductor integrated circuit main body 2 to the connection mechanisms 3 to 5, and the wirings L2 and L3 for connecting the power supply wirings Vcc and GND to the connection mechanisms 3 to 5, respectively. Thus, by writing the disconnection mechanisms 6 to 8, the wirings L1 to L3 are made to be non-conductive, respectively.

In addition, numeral 9 indicates each probing pad connected to each end of the connection mechanisms 3 to 5 and the disconnection mechanisms 6 to 9, and numeral 10 indicates each bonding pad connected to the semiconductor integrated circuit main body 2 and the power supply wirings Vcc and GND.

Hereinafter, the function of this embodiment will be described.

First, after completion of the semiconductor device, in the state that the connection mechanisms 3 to 5 are opened, a probe of a tester (not shown) is contacted with each probing pad 9 connected to each terminal of the monitor circuit 1 for investigating the characteristic of a device in the monitor circuit 1. The device has the same structure as the internal device constituting a part of the semiconductor integrated circuit main body 2. Accordingly, by carrying out the characteristic test for the monitor circuit 1, the characteristic of the internal device in the semiconductor integrated circuit main body 2 can be investigated.

In addition, if the monitor circuit 1 is previously connected to the semiconductor integrated circuit main body 2 by means of the connection mechanisms 3 to 5, it is added with the impedance of the semiconductor main body 2, which makes it impossible to accurately measure the characteristic of the monitor circuit 1. Accordingly, it is essential for the test of the monitor circuit 1 to make the connection mechanisms 3 to 5 in the non-written states, respectively.

The characteristic of the semiconductor integrated circuit main body 2 directly after completion is thus investigated with the aid of the monitor circuit 1, after which the connection mechanisms 3 to 5 are written to change the wirings L1 to L3 to be conductive. Thus, the monitor circuit 1 is connected to the inside of the semiconductor integrated circuit main body 2 and the power supply wirings Vcc and GND, to be thus made in the same operating state as in the internal circuit of the semiconductor integrated circuit 2.

As the internal circuit is operated by supplying a specified supply voltage and a signal to the semiconductor integrated circuit main body 2 through the bonding pads 10, the monitor circuit 1 is operated in the same condition as that of the internal circuit constituting a part of the semiconductor integrated circuit main body 2. Accordingly, in the case that there is generated hot carrier or electromigration in the internal circuit, the monitor circuit 1 is concurrently affected by the same influence.

The above operation is continuously made, and in the case that there occurs an inconvenience due to the deterioration of the device in the semiconductor integrated circuit main body 2, the operation is stopped, and the disconnection mechanisms 6 to 8 are written to be made in the disconnected states, so that the monitor circuit 1 is separated from the power supply wirings Vcc and GND and the semiconductor integrated circuit main body 2. The reason for this is that, in the non-disconnected states, the monitor circuit 1 is added with the impedance of the semiconductor integrated circuit main body 2, and accordingly the accurate characteristic of the monitor circuit 1 cannot be measured.

The probe of the tester is then contacted with each probing pad 9 conducted to the monitor circuit 1, to thus investigate the circuit characteristic. The monitor circuit 1 has the same structure as that of the internal circuit of the semiconductor integrated circuit main body 2 and is driven in the same condition, so that the characteristic of the internal circuit can be estimated from the test result.

This eliminates the need of dividing the internal circuit constituting a part of the semiconductor integrated circuit main body 2 by etching or laser cutting. Further, since each of the disconnection mechanisms 6 to 8 comprises the fuse such as polycrystalline silicon, the cutting operation can be simply performed for a short time by laser irradiation. The characteristic of the monitor circuit 1 is never changed during the above cutting operation.

(b) Embodiment 2

Next, as a second embodiment, the monitor circuit, connection mechanism and disconnection mechanism will be further fully described.

Figure 3:
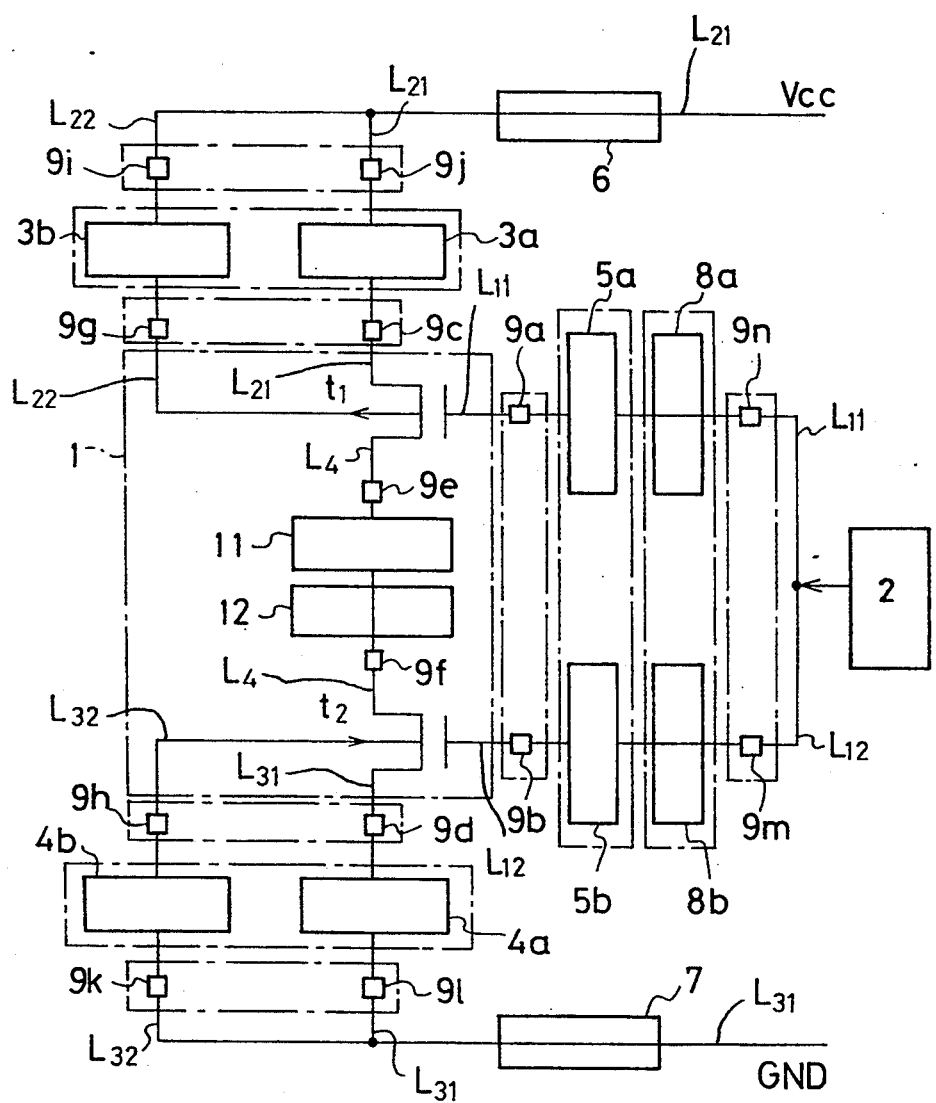
FIG. 3 is a circuit diagram of a second embodiment of the present invention.
Figure 4A:
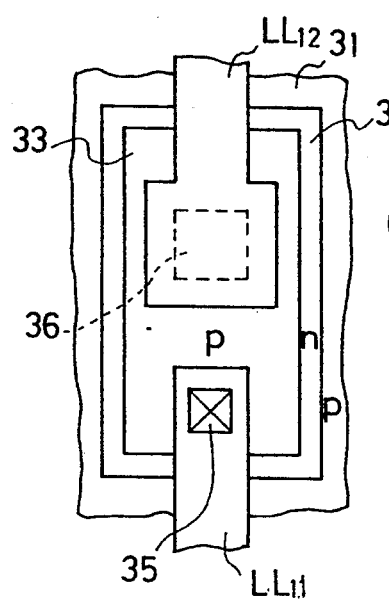
FIGS. 4A and 4B are a plan view and a sectional view showing a first form of the connection mechanism used in the present invention.
Figure 4B:
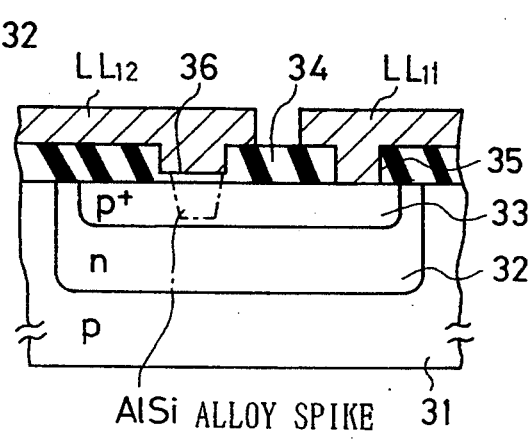
Figure 5A:
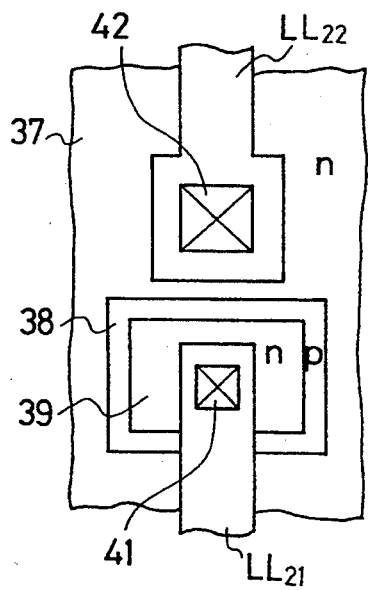
FIGS. 5A and 5B are a plan view and a sectional view showing a second form of the connection mechanism used in the present invention.
Figure 5B:
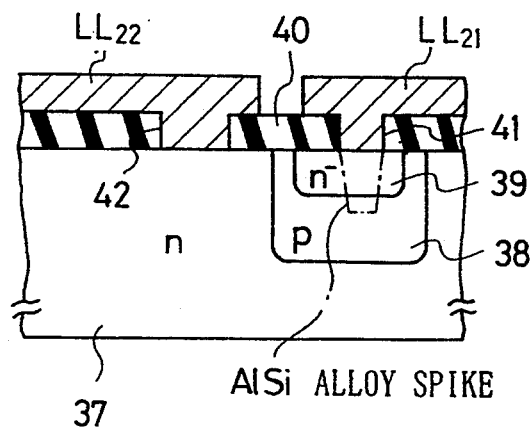
Figure 6A:
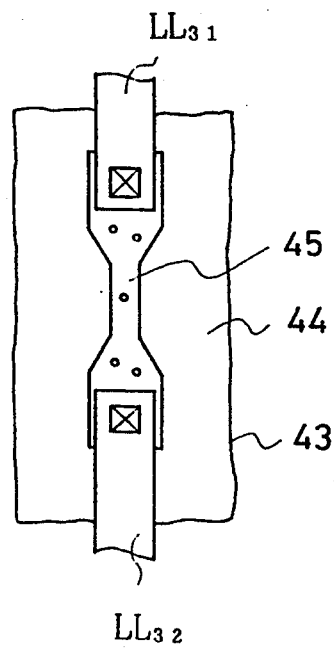
FIGS. 6A and 6B are a plan view and a sectional view showing one form of the connection mechanism used in the present invention.
Figure 6B:
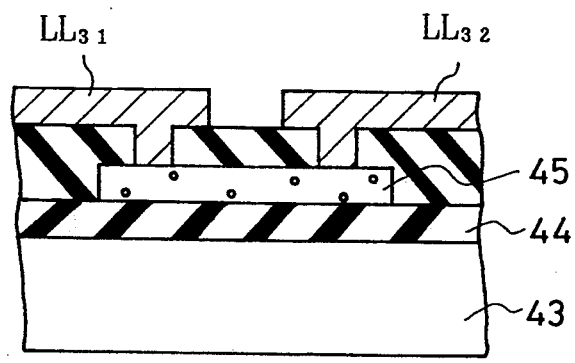
Figure 7:
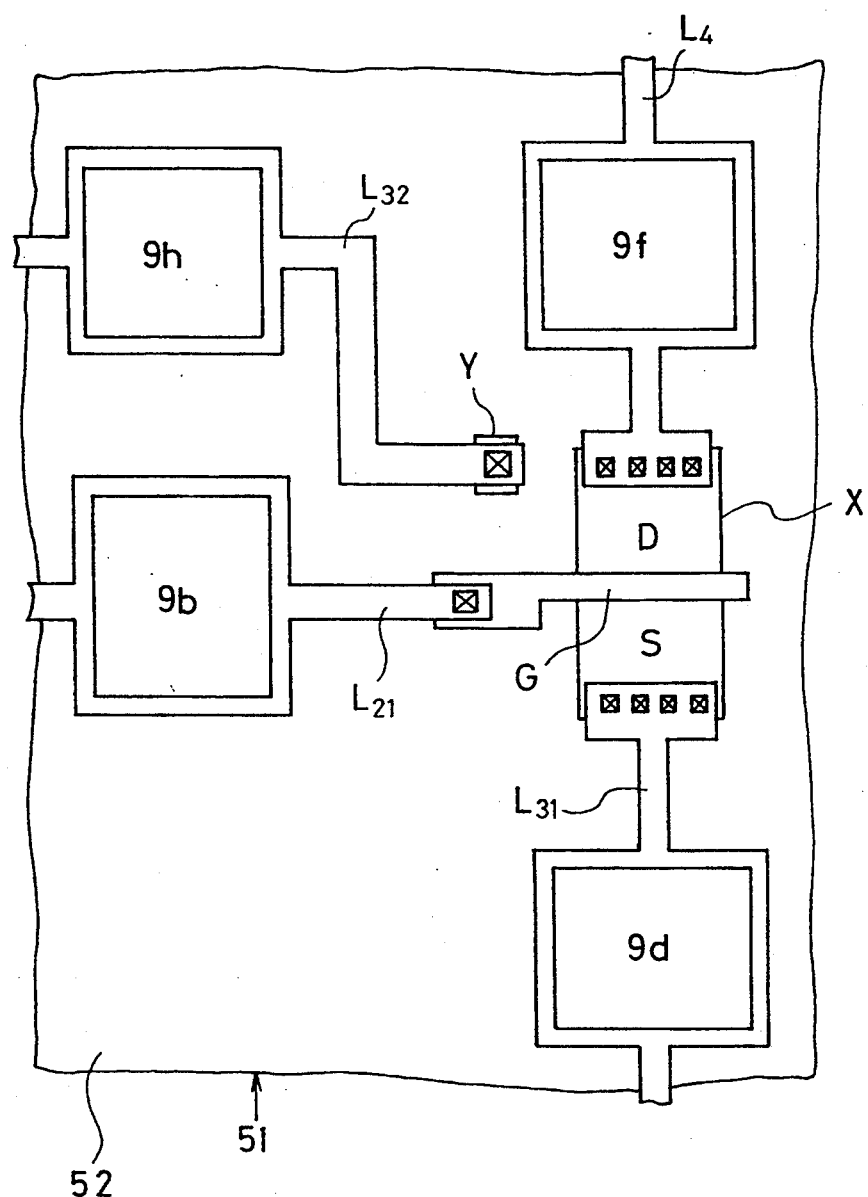
FIG. 7 is a plan view showing a part of a monitor circuit, the peripheral wirings and probing pads thereof in the second embodiment of the present invention.

FIG. 3 is a circuit diagram for explaining the second embodiment of the present invention; FIGS. 4A and 4B are a plan view and a sectional view showing a first form of a connection mechanism used in the present invention; FIGS. 5A and 5B are a plan view and a sectional view showing a second form of the connection mechanism; FIGS. 6A and 6B are a plan view and a sectional view showing one form of a disconnection mechanism used in the present invention; and FIG. 7 is a plan view showing a part of a monitor circuit and its peripheral parts.

As shown in FIG. 3, a monitor circuit 1 is constituted of a p-channel Metal Oxide Semiconductor Field Effect Transistor (pMOSFET) t1 and a n-channel Metal Oxide Semiconductor Field Effect Transistor (nMOSFET) t2. A CMOSFET formed of the pMOSFET t1 and nMOSFET t2 has the same structure as a CMOSFET (not shown) inside a semiconductor integrated circuit main body 2.

Connection mechanisms 5a, 5b and 11 and disconnection mechanisms 8a, 8b and 12 are connected in series, in wiring L4 for connecting the drain of the pMOSFET t1 to the drain of the nMOSFET t2, and wirings L11 and L12 for connecting the gates thereof to the semiconductor integrated circuit main body 2, respectively. Also, connection mechanisms 3a and 4a and disconnection mechanisms 6 and 7 are connected in series, in wirings L21 and L31 for connecting the sources of the pMOSFET t1 and the nMOSFET t2 to power supply wirings Vcc and GND, respectively. Further, wirings L22 and L32 for applying substrate potentials to the pMOSFET t1 and nMOSFET t2 are connected to the disconnection mechanisms 6 and 7 for the power supply wirings Vcc and GND through the connection mechanisms 3b and 4b, respectively.

Each of the above connection mechanisms 3a, 3b ... has a structure as shown in FIGS. 4A, 4B, or FIGS. 5A and 5B.

The connection mechanism as shown in FIGS. 4A and 4B has the following structure: namely, a p+-type impurity diffusion layer 33 is formed on the upper portion of a N well 32 provided to a p-type semiconductor substrate 31 of silicon or the like, and an insulating film 34 of SiO2, SiN or the like is formed thereon; and an electrode LL11 of aluminum connected to one end of the connection mechanism is connected to one side of the p+-impurity diffusion layer 33 through an opening portion 35 formed on the insulating film 34, whereas an electrode LL12 connected to the other end of the connection mechanism is connected to a recessed portion 36 of the insulating film 34 formed on the p+-impurity diffusion layer 33. In addition, the electrodes LL11 and LL12 are the terminals of the connection mechanism to be connected to each wiring.

Also, the connection mechanism as shown in FIGS. 5A and 5B has the following structure: namely, a n-type impurity diffusion layer 39 is formed on the upper portion of a p-type impurity diffusion layer 38 provided to a n-type semiconductor substrate 37; and an electrode LL21 of aluminum connected to one end of the connection mechanism is connected to one side of the n-type impurity diffusion layer 39 through a contact hole 41 formed on an insulating film 40 covering the n-type semiconductor substrate 37, whereas an electrode LL22 connected to the other end of the connection mechanism is connected to the upper surface of the n-type semiconductor substrate 37 in the vicinity of the p-type impurity diffusion layer 38 through another contact hole 42. In addition, the electrodes LL21 and LL22 are the terminals of the connection mechanism to be connected to each wiring.

In addition, the conductive types of the connection mechanism are not limited to the above, and the reversed conductive types may be used.

On the other hand, the above disconnection mechanism has a structure as shown in FIGS. 6A and 6B, which comprises a fuse 45 of polycrystalline silicon formed on an insulating film 44 covering a semiconductor substrate 43, wherein both ends thereof are connected to electrodes LL31 and LL32, respectively. In addition, the electrodes LL31 and LL32 are the terminals of the connection mechanism to be connected to each wiring.

Incidentally, in FIG. 3, numerals 9a to 9h indicate probing pads led from the gates, sources, drains and substrate potential wirings of the pMOSFET t1 and nMOSFET t2; numerals 9i to 9l are probing pads led from the wirings L21, L22, L31, L32 between the disconnection mechanisms 6 and 7 connected to the power supply wirings Vcc and GND, and the connection mechanisms 3a, 3b, 4a and 4b; and 9m and 9n are probing pads led from the wirings L11 and L12 between the disconnection mechanisms 8a and 8b connected to the gates of the pMOSFET t1 and nMOSFET t2, and the semiconductor integrated circuit main body 2.

Hereinafter, the flat surface structure of a part of the monitor circuit and the peripheral probing pads will be described with reference to FIG. 7.

In this figure, a device formation area X and a substrate voltage applying area Y of a semiconductor substrate 51 is surrounded by a local oxidation of silicon 52. A gate electrode G of nMOSFET t2 is formed so as to cross the center of the device formation area X. The ions of impurities are implanted to the semiconductor substrate 51 on the device formation area X using the gate electrode G as a mask, and are diffused to form a source layer S and a drain layer D.

Then, these are covered with a layer insulating film (not shown), and contact holes are formed on the layer insulating film at the portions of the gate electrode G, source layer S, drain layer D and substrate potential applying area Y, and thus the wirings L21, L31, L32 and L4 are contacted thereto through respective holes. Parts of the wirings L21, L31, L32 and L4 are widely formed in rectangular shapes, which are used as the probing pads 9b, 9d, 9h and 9f.

The function of the above connection mechanism will be described below.

First, in the connection mechanism as shown in FIGS. 4A and 4B, a voltage of about 10 V is applied between the electrodes LL11 and LL12 separated from each other on the p+-type impurity diffusion layer 33 to generate the dielectric breakdown at the thin portion of the recessed portion 36 of the insulating film 34. This permits the electrode LL11 of aluminum to penetrate to the p+-type impurity diffusion layer 33 and hence to generate the AlSi alloy spike. As a consequence, the wiring LL11 is made to be conductive through the p+-type impurity diffusion layer 33.

Also, in the connection mechanism as shown in FIGS. 5A and 5B, as a voltage of about 10 V is applied between the divided electrodes LL21 and LL22, there is generated the AlSi alloy spike penetrating to the p-type impurity diffusion layer 38 through the n-type impurity diffusion layer 39. Thus, the electrodes LL21 and LL22 are connected to each other through the p-n junction, to be in the written state. Accordingly, the connection mechanism has the directional characteristic in the current applying direction, and is used in the case that the current is applied only in the one direction.

In addition, the application of the voltage to the above connection mechanisms is made through the probing pads 9a to 9n.

The function of the disconnection mechanism will be described below.

In the disconnection mechanism as shown in FIGS. 6A and 6B, a current is allowed to flow in the electrodes LL31 and LL32 through a fuse 45 in the fabricated initial stage. Also, in the case of disconnecting the electrodes, the fuse 45 is fused and cut by laser, to thereby disconnect the wirings.

Next, the monitoring method using these connection mechanisms and disconnection mechanisms will be described.

First, as shown in FIG. 3, in the state that all of the connection mechanisms 3a, 3b, 4a, 4b, 5a, 5b and 11 are open (non-written state), the characteristics of the pMOSFET t1 and the nMOSFET t2 are measured. As a result, the device characteristic of the internal circuit of the semiconductor integrated circuit main body 2 having the same structure as the monitor circuit 1 can be easily estimated. After the completion of this measurement, all of the connection mechanisms 3a, 3b, 4a, 4b, 5a, 5b and 11 are made to be in the connected state, so that the monitor circuit 1 is connected to the semiconductor integrated circuit main body 2 and the power supply wirings Vcc and GND.

In this case, the clock signal applied to the inside of the semiconductor integrated circuit main body 2 is inputted to the gates of the pMOSFET t1 and nMOSFET t2 of the monitor circuit 1, to thus drive the monitor circuit 1 in parallel to the internal circuit.

In the case that the characteristic of the internal circuit is investigated after the semiconductor integrated circuit main body 2 is driven for a specified time under the various conditions by supply of the power and the signal, the following operation is made:

The disconnection mechanisms 6, 7, 8a, 8b and 12 are made in the disconnected state, and the pMOSFET t1 and the nMOSFET t2 are separated from the semiconductor integrated circuit main body 2. Then, the probe of the tester is contacted with each of the probing pads 9a to 9h, to measure the device characteristic of the monitor circuit 1, thereby making it possible to estimate the characteristic of the internal circuit of the semiconductor integrated circuit main body 2.

In addition, the measurement of the characteristic of the pMOSFET t1 and the nMOSFET t2 is made through the probing pads 9a to 9h, to thereby eliminate the need of etching and laser cutting.

Also, the cutting of the fuse 45 is instantly made, which does not take a lot of labor. Also, during the cutting, the characteristic of the monitor circuit 1 is not changed.

(c) Embodiment 3

Next, a third embodiment will be described using a device in which a flip-flop and one nMOSFET are taken as an internal circuit and a monitor circuit, respectively.

Figure 8:
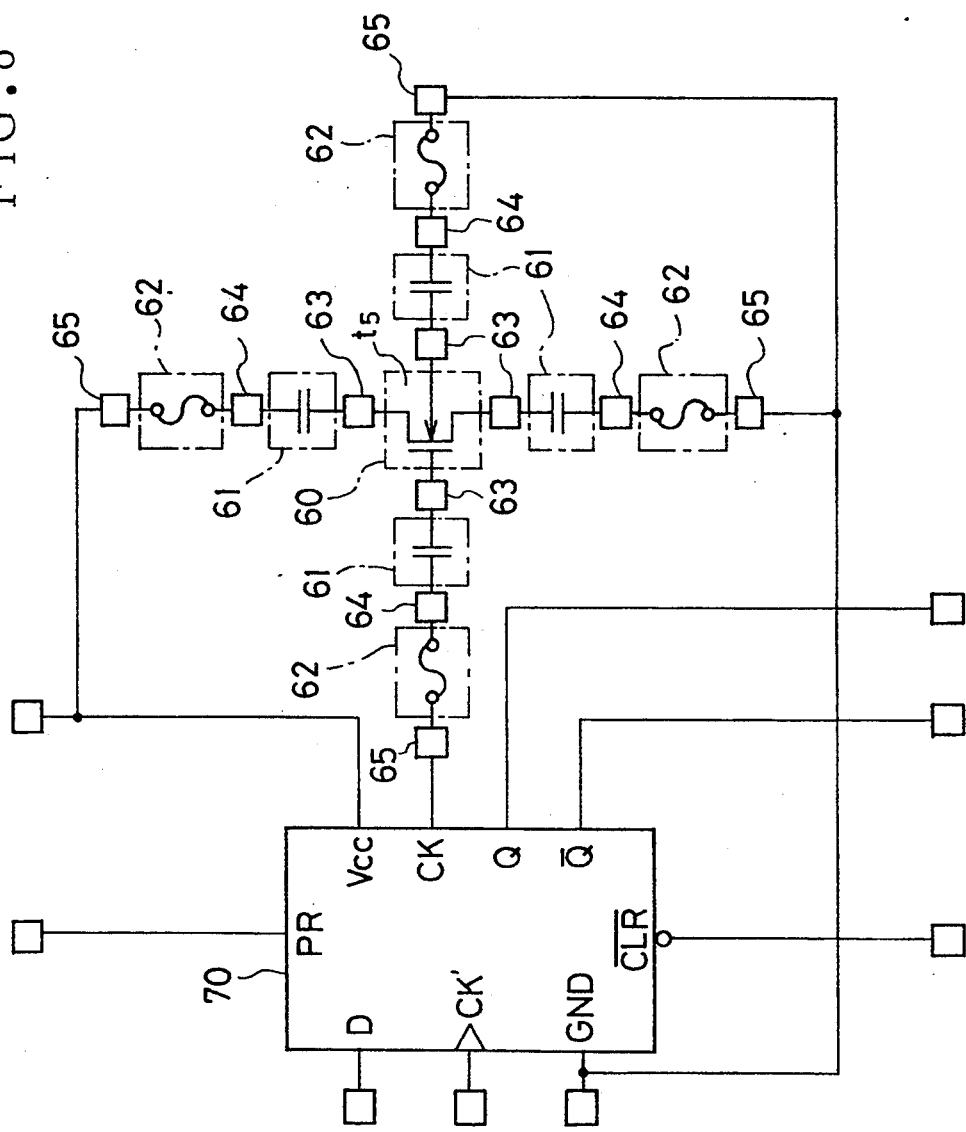
FIG. 8 is a diagram showing an internal circuit and a monitor circuit of a third embodiment of the present invention.
Figure 9:
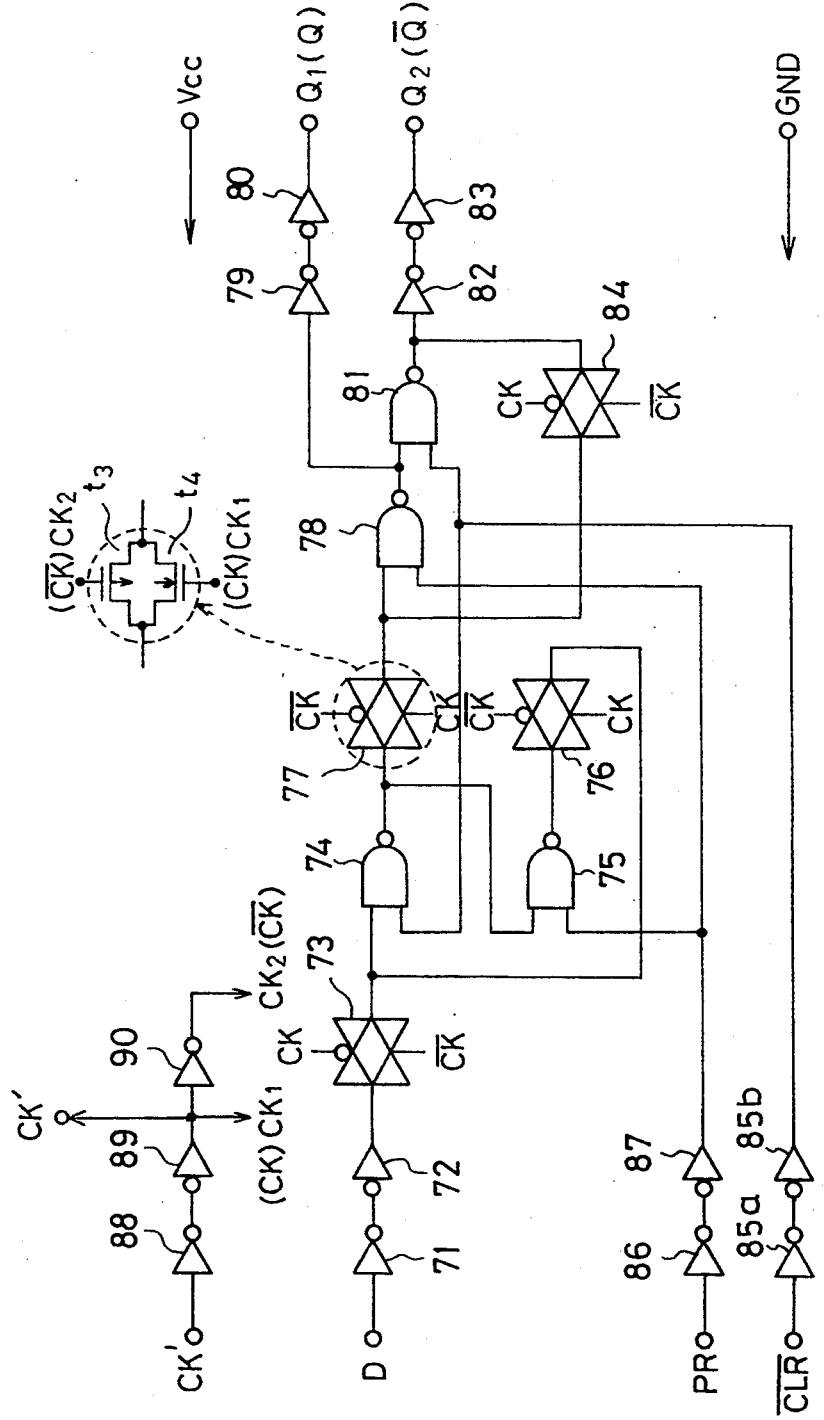
FIG. 9 is a circuit diagram showing one form of a flip-flop circuit used in the third embodiment of the present invention.

FIG. 8 is a circuit diagram for explaining the third embodiment of the present invention; and FIG. 9 is a flip-flop circuit diagram used in the present invention. First, the construction of the flip-flop circuit will be described.

In a flip-flop circuit 70 as shown in FIG. 9, a data input terminal D is connected to an input terminal of a first NAND gate 74 through double inverters 71 and 72 and a first transmission 73. Also, the output terminal of the NAND gate 74 is fed-back to the above input terminal of the first NAND gate 74 passing through a second NAND gate 75 and a second transmission 76 in this order. Further, the output terminal of the first NAND gate 74 is inputted to a third NAND gate 78 through a third transmission 77.

The output terminal of the third NAND gate 78 is outputted to a first data output terminal Q1 through double inverters 79 and 80. Also, the output of the third NAND gate 78 is outputted to a second data output terminal Q2 passing through a fourth NAND gate 81 and double inverters 82 and 83 in this order. In this case, the signal from the second output terminal Q2 is reversed to the signal to the first output terminal Q1.

Further, the signal passing through the fourth NAND gate 81 is fed-back and connected to the above input terminal of the third NAND gate 78 through a fourth transmission 84.

On the other hand, a clear signal terminal CLR at the flip-flop circuit 70 is connected to the other input terminals of the first and fourth NAND gates 74 and 81 through double intervals 85a and 85b, respectively. Also, a preset signal terminal PR is connected to the other input terminals of the second and third NAND gates 75 and 76 through double inverters 86 and 87.

Also, a clock signal inputted from a clock signal terminal CK' at the flip-flop circuit 70 is outputted as a clock signal CK1 through double inverters 88 and 89, and a reversed clock signal CK2 is outputted through one inverter 90. The above signals are inputted in the transmission 73, 76, 77 and 84. In this case, the first and fourth transmissions 73 and 84 are intended to be reversed to the second and third transmissions 76 and 77.

Incidentally, as shown in the portions surrounded by the broken lines in FIG. 9, the transmission 77 is constituted by connection of the sources and drains of the pMOSFET t3 and nMOSFET t4, wherein the gates thereof are added with the clock signals CK1 and CK2.

For example, in the case of measurement of the characteristic of a nMOSFET t4 before and after usage, as shown in FIG. 8, the monitor circuit 60 is constituted of a nMOSFET t5 having the same structure, and which is driven synchronously with the clock signals CK1 and CK2.

As shown in FIG. 8, in the monitor circuit 60 thus constituted of the nMOSFET t5, the drain of the nMOSFET t5 is connected to the power supply terminal Vcc of the flip-flop circuit 70; the source and the substrate voltage wiring are connected to the power supply terminal GND of the flip-flop circuit 70; and the gate is connected to the clock signal terminal CK'.

In this case, in the wirings for connecting the monitor circuit 60 to the flip-flop circuit 70, connection mechanisms 61 and disconnection mechanisms 62 and probing pads 63 and 64 having the same structures as shown in Embodiment 2 are formed.

Next, the function of this embodiment will be described.

First, in the state where each connection mechanism 61 is opened, the probe of the tester is contacted with each probing pad 63, to inspect the characteristic of the nMOSFET t5 of the monitor circuit 60, thereby making it possible to estimate the characteristic of the nMOSFET t4 of the transmission 77.

After that, the connection mechanism 61 is made to be in the written state in the manner as described in Embodiment 2, so that the monitor circuit 60 is connected to the flip-flop circuit 70. Then, as the flip-flop circuit 70 is driven under the specified condition, the nMOSFET t5 in the monitor circuit 60 is operated in the same condition on the basis of the clock signals applied to the nMOSFET t4 of the transmission 77.

After the flip-flop circuit 70 and the monitor circuit 60 are driven for a specified time, in the manner as described in Embodiment 2, the monitor circuit 60 is separated from the flip-flop circuit 70 by means of each disconnection mechanism 62, and then the probe of the tester is contacted with each probing pad 63 (or 64) to test the deteriorated characteristic of the nMOSFET t5, thereby determining the deteriorated state of the nMOSFET t4 of the transmission 77 due to the hot carrier and the like.

(d) Embodiment 4

Next, a fourth embodiment will be described using a semiconductor device having a monitor circuit including a bipolar transistor in its internal circuit with reference to FIG. 10.

Figure 10:
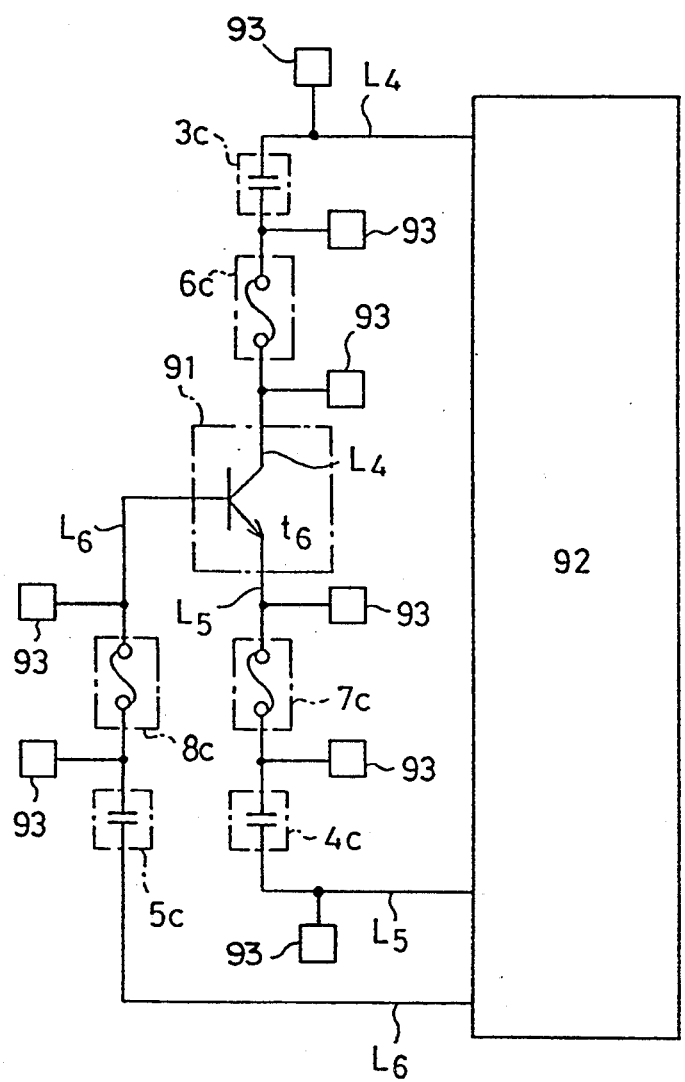
FIG. 10 is a circuit diagram showing a fourth embodiment of the present invention.

In FIG. 10, numeral 91 indicates a monitor circuit in a semiconductor integrated circuit device formed on one semiconductor chip. A bipolar transistor t6 constituting the monitor circuit 91 is formed in the same structure as a bipolar transistor constituting a part of a semiconductor integrated circuit main body 92. The emitter, base, and collector thereof are connected to a semiconductor integrated circuit main body 92 through three ways of wirings L4 to L6 in which connection mechanisms 3c, 4c and 5c and disconnection mechanisms 6c, 7c and 8c having the same structures as in Embodiment 2 are connected in series to each other.

In addition, numeral 93 indicates each probing pad connected to the terminal, on the side near the monitor circuit 91, of each of the connection mechanisms 3c, 4c and 5c and the disconnection mechanisms 6c, 7c and 8c.

The function of this embodiment will be described below.

First, after completion of the semiconductor device, in the state that the connection mechanisms 3c, 4c and 5c are opened, the probe of the tester (not shown) is contacted with each probing pad 93 connected to the terminal thereof on the side near the monitor circuit 91, to investigate the characteristic of the bipolar transistor t6 in the monitor circuit 91. The device has the same structure as the bipolar transistor constituting a part of the semiconductor integrated circuit main body 92. Accordingly, by carrying out the characteristic test of the monitor circuit 91, it is possible to investigate the characteristic of the bipolar transistor inside the semiconductor integrated circuit main body 92.

Thus, the characteristic of the bipolar transistor inside the semiconductor integrated circuit main body 92 directly after completion is investigated by means of the monitor circuit 91, after which the connection mechanisms 3c to 5c are written to change the wirings L4 to L6 to be conductive for connecting the monitor circuit 91 to the semiconductor integrated circuit main body 2, to thereby make the internal bipolar transistors thereof in the same operating state. Consequently, the bipolar transistors are operated in the same condition, and in the case that there occurs the junction breakdown, withstand pressure deterioration and the like in the bipolar transistor inside the semiconductor integrated circuit main body 92, the monitor circuit 1 is affected by the same influence.

The above operation is continuously made, and in the case that there occurs an inconvenience due to the device deterioration in the semiconductor integrated circuit main body 92, the operation is stopped. Then, the disconnection mechanisms 6c to 8c are written to make the midways of the wirings L4 to L6 in the disconnected states, to separate the monitor circuit 91 from the semiconductor integrated circuit main body 92. The reason for this is that, in the non-disconnected state, since the monitor circuit 91 is added with the impedance of the semiconductor integrated circuit main body 92, the accurate characteristic of the monitor circuit 91 cannot be measured.

Then, the probe of the tester is contacted with each probing pad 93 conducted to the monitor circuit 91, to investigate the characteristic of the internal bipolar transistor t6, thereby making it possible to accurately investigate the characteristic of the bipolar transistor inside the semiconductor integrated circuit main body 92.

(e) Embodiment 5

Next, a fifth embodiment will be described using a device having a monitor circuit including a bipolar transistor in its internal circuit with reference to FIG. 11.

Figure 11:
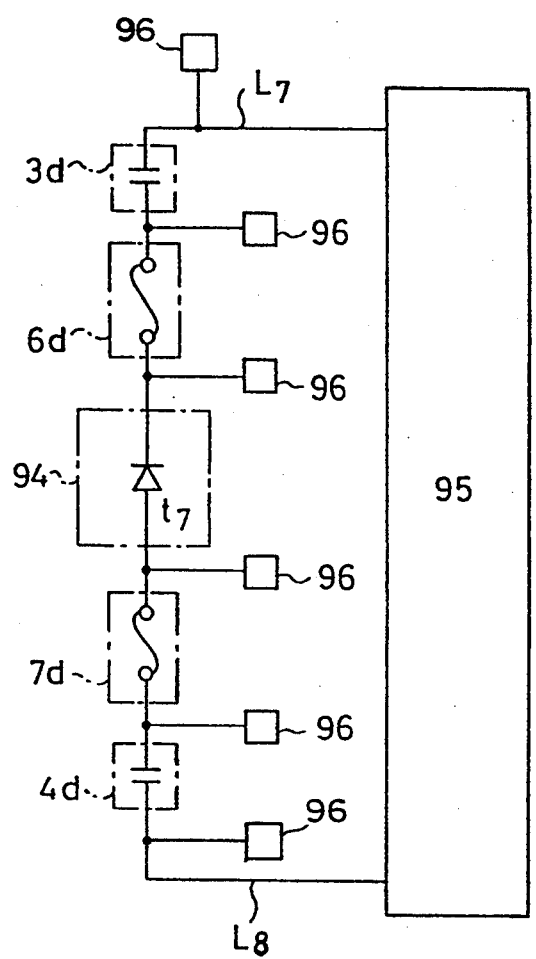
FIG. 11 is a circuit diagram showing a fifth embodiment present invention.

In FIG. 11, numeral 94 indicates a monitor circuit in a semiconductor device formed on one semiconductor chip. A diode t7 constituting the monitor circuit 94 is formed in the same structure as a diode constituting a part of a semiconductor integrated circuit main body 95. The anode and cathode are connected to the semiconductor integrated circuit main body 95 through two wirings L7 and L8 for connecting connection mechanisms 3d and 4d to disconnection mechanisms 6d and 7d having the same structures as described in Embodiment 2 in series.

In addition, numeral 96 indicates each probing pad connected to the terminal, on the side near the monitor circuit 94, of each of the disconnection mechanisms 6d and 7d and the connection mechanisms 3d and 4d.

The function of this embodiment will be described below.

First, after completion of the semiconductor device, in the state that the connection mechanisms 3d and 4d are opened, a probe of the tester (not shown) is contacted with each probing pad 96 conducted to the terminal of the monitor circuit 94, to investigate the characteristic of the diode t7 in the monitor circuit 94. The diode has the same structure as a diode constituting a part of the semiconductor integrated circuit main body 95. Accordingly, by carrying out the characteristic test of the monitor circuit 94, the characteristic of the diode inside the semiconductor integrated circuit main body 95 can be investigated.

Thus, the characteristic of the bipolar transistor of the semiconductor integrated circuit main body 95 directly after completion is investigated by means of the monitor circuit 94, after which the connection mechanisms 3d and 4d are written to connect the monitor circuit 94 to the semiconductor integrated circuit main body 95, thereby making the diodes therein in the same operating state.

Thus, these bipolar transistors are operated under the same condition, and in the case that there occurs the junction breakdown in the bipolar transistor inside the semiconductor integrated circuit main body 95, the bipolar transistor t7 inside the monitor circuit 94 is affected by the same influence.

The above operation is continuously made, and in the case that there occurs an inconvenience due to the device deterioration in the semiconductor integrated circuit main body 95, the operation is stopped. Subsequently, the disconnection mechanisms 6d and 7d are written to separate the monitor circuit 94 from the semiconductor integrated circuit main body 95.

The probe of the tester is contacted with each probing pad 96 conducted to the monitor circuit 94, to investigate the characteristic of the diode therein, thereby making it possible to accurately estimate the characteristic of the bipolar transistor inside the semiconductor integrated circuit main body 95.

What is claimed is:

1. A semiconductor integrated circuit device comprising:
   a semiconductor integrated circuit main body having a circuit to be monitored;
   a monitor circuit to monitor said circuit to be monitored, provided on a chip in which said semiconductor integrated circuit main body is also mounted, said monitor circuit having the same structure as that of said circuit to be monitored;

wirings extending from said monitor circuit to the semiconductor integrated circuit main body;

connection mechanisms connected in series with said monitor circuit and said semiconductor integrated circuit main body through said wirings to disconnect said monitor circuit from said semiconductor integrated circuit main body through said wirings during an initial test state of said monitor circuit and to connect said monitor circuit to said semiconductor integrated circuit main body through said wirings during an operation state of said semiconductor integrated circuit main body so that said monitor circuit and said circuit to be monitored operate under the same operational condition; and disconnection mechanisms connected in series with said monitor circuit and said semiconductor integrated circuit main body through said wirings to connect said monitor circuit with said semiconductor integrated circuit main body through said wirings during the operation state of said semiconductor integrated circuit main body so that said monitor circuit and said circuit to be monitored operate under the same operational condition and to disconnect said monitor circuit from said semiconductor integrated circuit main body through said wirings during a second test state of said monitor circuit after completion of the operation state.

2. A semiconductor integrated circuit device according to claim 1, wherein said wirings are connected to power supply wirings and said semiconductor integrated circuit main body.

3. A semiconductor integrated circuit device according to claim 1, further comprising electrode pads, each said electrode pad being led from a terminal, on a side near said monitor circuit, of each of said disconnection mechanisms.

4. A semiconductor integrated circuit device according to claim 3, wherein each said electrode pad is led from the terminal, on the side near said monitor circuit, of each of terminals of said disconnection mechanisms and said connection mechanisms.

5. A semiconductor integrated circuit device according to claim 1, wherein each of said connection mechanisms comprises a dielectric breakdown type semiconductor device.

6. A semiconductor integrated circuit device according to claim 1, wherein each of said disconnection mechanisms comprises a fuse of semiconductor.

7. A semiconductor integrated circuit device according to claim 1, wherein said monitor circuit includes a field effect transistor.

8. A semiconductor integrated circuit device according to claim 1, wherein said monitor circuit includes a complementary field effect transistor circuit.

9. A semiconductor integrated circuit device according to claim 1, wherein said monitor circuit includes a bipolar transistor.

10. A semiconductor integrated circuit device according to claim 1, wherein said monitor circuit includes a diode.

11. A semiconductor integrated circuit device according to claim 1, wherein each of said connection mechanisms comprises a pn-junction breakdown type semiconductor device.

* * * * *